United States Patent [19]

Lucas

[11] Patent Number: 4,531,285
[45] Date of Patent: Jul. 30, 1985

[54] METHOD FOR INTERCONNECTING CLOSE LEAD CENTER INTEGRATED CIRCUIT PACKAGES TO BOARDS

[75] Inventor: Michael R. Lucas, Baltimore, Md.

[73] Assignee: The United States of America as represented by the Secretary of the Navy, Washington, D.C.

[21] Appl. No.: 477,692

[22] Filed: Mar. 21, 1983

[51] Int. Cl.³ .......................... H01R 43/00; B32B 3/10
[52] U.S. Cl. ........................................ 29/827; 428/54; 428/459
[58] Field of Search .......................... 29/827, 876, 846; 174/52 FP, 68.5; 339/17 CF, 17 F; 357/69, 70; 428/54, 459

[56] References Cited

U.S. PATENT DOCUMENTS

| | | | |
|---|---|---|---|
| 3,168,617 | 2/1965 | Richter | 174/68.5 X |
| 3,374,537 | 3/1968 | Doelp, Jr. | |
| 3,579,206 | 5/1971 | Grange | 339/17 F X |
| 3,765,084 | 10/1973 | Kent | |
| 3,971,428 | 7/1976 | Hall | 164/46 |
| 4,038,744 | 8/1977 | Cheype et al. | 28/827 |
| 4,054,238 | 10/1977 | Lloyd et al. | 228/173 |
| 4,063,993 | 12/1977 | Burns | 29/846 X |
| 4,075,420 | 2/1978 | Walton | 174/68.5 |
| 4,085,502 | 4/1978 | Ostman et al. | |
| 4,155,615 | 5/1979 | Zimmerman, Jr. et al. | 29/827 X |
| 4,188,714 | 2/1980 | Jean | 29/827 |
| 4,330,935 | 5/1982 | Blair, Jr. et al. | 29/884 |
| 4,331,740 | 5/1982 | Burns | 428/572 |

FOREIGN PATENT DOCUMENTS 147437  4/1981  Fed. Rep. of Germany ........ 29/840

Primary Examiner—Howard N. Goldberg
Assistant Examiner—Carl J. Arbes
Attorney, Agent, or Firm—R. F. Beers; H. A. David

[57] ABSTRACT

The invention is a method for interconnecting close lead center integrated circuit package to boards by forming the leads as follows: (1) bonding the lead frame material to a thin insulating film, and the (2) forming the leads. Next, the film base is removed selectively where connections to the package and board will be made. The lead material is then plated and formed to provide stress relief in the package-to-board interconnect. The lead frame is then attached to the package and board.

2 Claims, 4 Drawing Figures

METHOD FOR INTERCONNECTING CLOSE LEAD CENTER INTEGRATED CIRCUIT PACKAGES TO BOARDS

BACKGROUND OF THE INVENTION

1. Field of the Invention

The present invention relates to integrated circuit fabrication techniques, and more particularly to a method for interconnecting integrated circuit chip packages having package leads on very close centers to an interconnect board such that the leads are formed and soldered on very close centers, yet are protected from handling damage and lead-to-lead shorting.

2. Description of the Prior Art

The trend in integrated circuit manufacture is toward greater intergration of functions on a single chip. This results in more gates on the chips and higher input/output (I/O) pin counts. I/O requirements of over 200 leads on a single chip are projected. Packaging of these chips into a single chip package is desirable due to the high cost of the chip, the requirement for testing the chip before committing to an assembly, and the desire to easily remove and replace a defective chip in an assembly. However, current packages require extremely large sizes due to the package perimeter required for the large number of leads. A 200 lead flatpackage with leads on four sides with a standard 50 mil lead spacing would have a size over 1.5 inches square, resulting in an expensive, low-density package. Lead centers as small as 12.5 or 10 mils on a chip package are desirable. As the lead center decrease, however, the leads become more fragile and susceptible to being bent which causes alignment problems when mounting the package to a board, or even electrical shorting if the leads are so badly bent as to touch one another. Also, after the package is mounted the fragile leads are still susceptible to handling damage and possible shorts.

SUMMARY OF THE INVENTION

Accordingly, the present invention provides a method for interconnecting close lead center integrated circuit packages to boards by forming the leads as follows: (1) bonding the lead frame material to a thin insulating film, and then (2) forming the leads. Next, the film base is removed selectively where connections to the package and board will be made. The lead material is then plated and formed to provide stress relief in the package-to-board interconnect. Finally, the lead frame is attached to the package and board.

Therefore, it is an object of the present invention to provide a method for interconnecting close lead center integrated circuit packages to interconnecting boards which will avoid damage and possible shorting of leads during handling.

Other objects, advantages and novel features of the present invention will be apparent from the following detailed description read in conjunction with the appended claims and attached drawing.

DESCRIPTION OF THE PREFERRED EMBODIMENT

Figure 1:
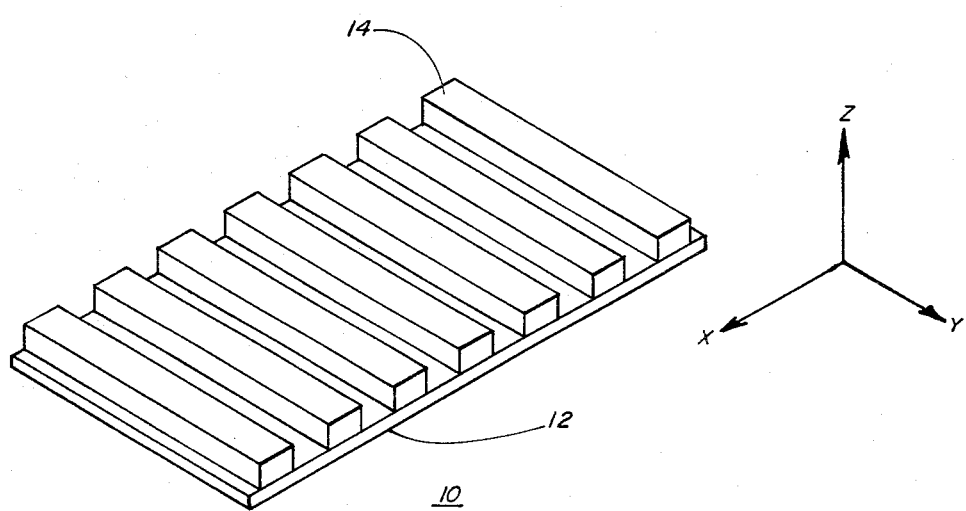
FIG. 1 is a perspective view of a lead frame with close center leads according to the present invention.

The first step in a method for interconnecting close lead center integrated circuit packages to an interconnect board is to form a lead frame 10. Lead frame material is sheet form, such as Kovar sheet or copper sheet, is bonded using standard methods to a thin insulating film 12, such as Kapton. The lead frame material and thickness, and the film base material and thickness, are so chosen to allow the lead frame 10 to be later formed in the "Z" axis and maintain its shape due to the deformation of the metal leads, yet maintain lead-to-lead spacing in the "X" direction due to the film base. The leads 14 are then formed by some means such as etching the lead frame material, resulting in the lead frame 10 shown in FIG. 1.

Figure 2:
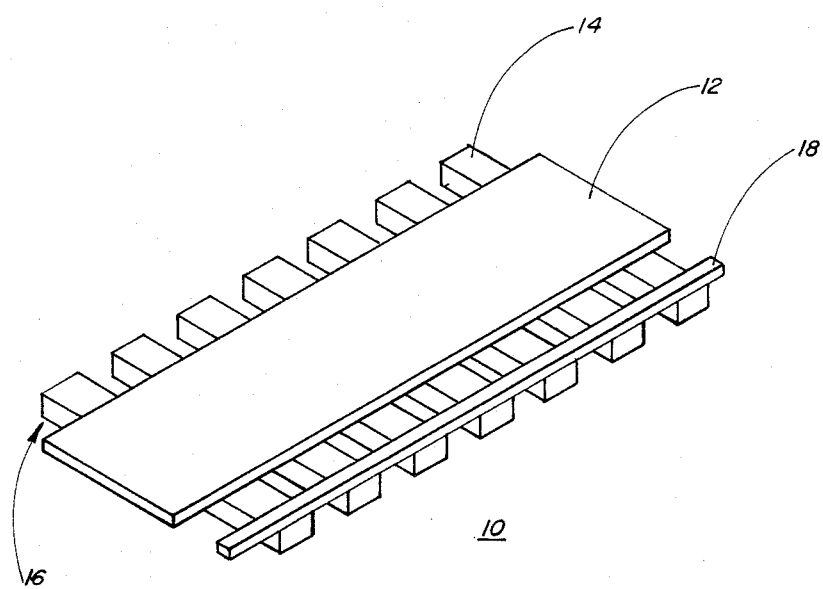
FIG. 2 is a perspective view of the lead frame of FIG. 1 after selective film removal.

Next, the film base 12 is selectively removed by some means such as laser ablation to remove material where connections to the package and interconnect board will later be made. The resulting lead frame 10 is illustrated in FIG. 2. At one end 16 a small strip of material has been removed so only a short length of leads 14 are cantilever supported. An alternate method is shown at the other end where a small strip 18 of material has been left so there is no cantilevered, or unsupported, lead ends. The lead material is plated with a suitable material such as gold or solder to prevent corrosion and to aid future soldering operations.

Figure 3:
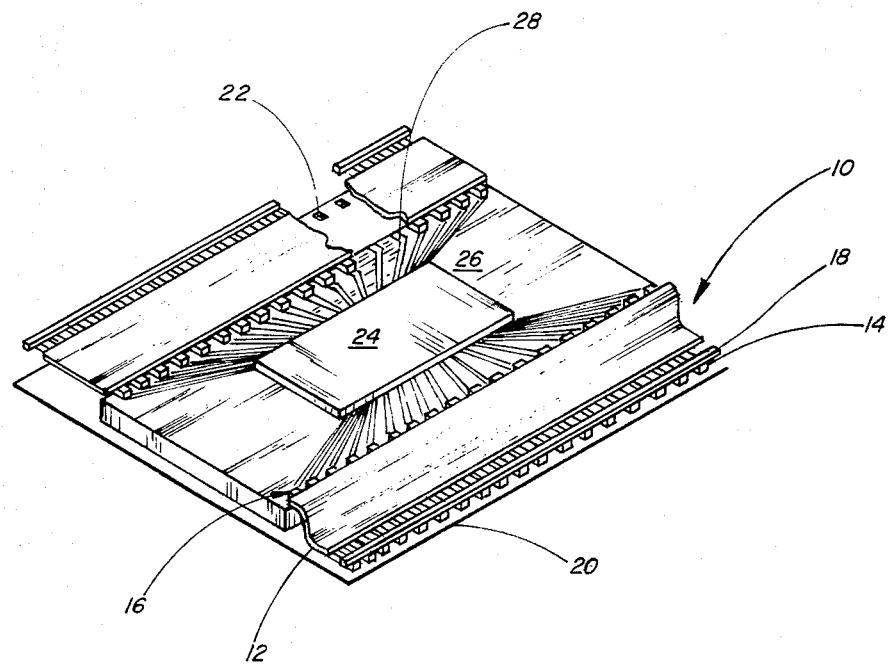
FIG. 3 is a perspective view of an integrated circuit package interconnected to a board by the lead frame of FIG. 2.
Figure 4:
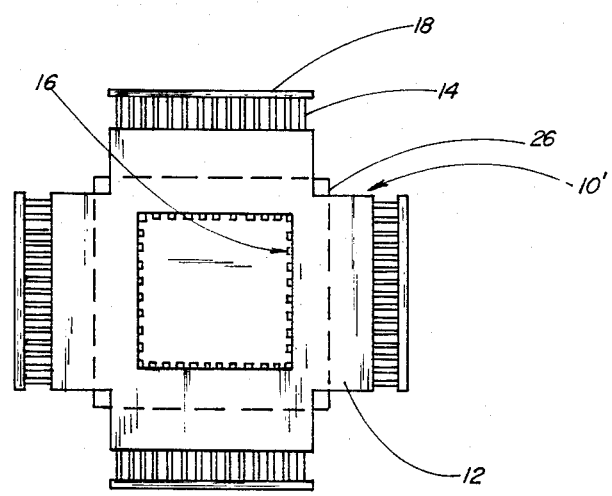
FIG. 4 is a top plan view of a lead frame for four-sided lead attachment.

The lead frame 10 is formed in an "S" profile in the "Z" axis as shown in FIG. 3 to provide stress relief in the package-to-board interconnect. A typical interconnect board 20 has a plurality of mounting pads 22. A chip 24 is mounted on a chip package 26, the package in turn being bonded to the interconnect board 20. A single metalization layer 28 on the package 26 is etched to form leads from the chip 24 to the edge of the package. The lead frame 10 can be either (1) attached to the package 26 first, and then package and lead frame attached to the board 20; or (2) the package can be bonded to the board with an adhesive and the lead frame attached to both the package and board. The lead bonding may be accomplished by soldering, using a gang bonding technique to solder a whole side of leads at once, or even all sides at once. A lead frame 10' for attaching leads to all four sides of a package 26 is shown in FIG. 4.

Thus, the present invention provides a method for interconnecting close lead center integrated circuit packages to an interconnect board which uses an inexpensive, unleaded package with a single metalization layer, and which via a film support minimizes the possibility of lead damage while leaving connection joints visible for inspection after soldering.

What is claimed is:

1. A method for interconnecting a close lead center integrated circuit package to an interconnect board comprising the steps of:
    forming a lead frame having a plurality of leads bonded to an insulating film material, said forming step comprising the steps of bonding a lead frame material to said insulating film material and etching said lead frame material to form said leads, said lead frame material and said insulating film material being of such materials and thickness so that when said lead frame is subsequently shaped said leads maintain their shape while maintaining their lead-to-lead spacing;

selectively removing said insulating film material from said leads where connections to said package and said board are to be made, said selectively removing step comprising the step of laser ablating said insulating film material to form an exposed portion near the lead ends, retaining a small strip of said insulating film material at said lead ends for support;

shaping said lead frame to provide stress relief in the package-to-board interconnect; and attaching said lead frame to said package and board to form the package-to-board interface.

2. A lead frame for interconnecting a close lead center integrated circuit package to a interconnect board comprising:

an insulating film;

a plurality of leads bonded to said insulating film, said insulating film being selectively removed from said leads where interconnections to said package and said board are to be made, said leads and said insulating film being of a material and thickness to allow said lead frame to be shaped in the form of an "S" profile in the Z-direction while maintaining lead shape and lead-to-lead spacing;

said leads comprising an exposed portion near the ends for attachment to said package and said board; and a thin strip of said insulating film being attached across said ends to support said ends.

* * * * *